United States Patent
Luo et al.

(10) Patent No.: US 7,208,818 B2
(45) Date of Patent: Apr. 24, 2007

(54) POWER SEMICONDUCTOR PACKAGE

(75) Inventors: Leeshawn Luo, Santa Clara, CA (US);
Anup Bhalla, Santa Clara, CA (US);
Sik K. Lui, Sunnyvale, CA (US);
Yueh-Se Ho, Sunnyvale, CA (US);
Mike F. Chang, Cupertino, CA (US);
Xiao Tian Zhang, San Jose, CA (US)

(73) Assignee: Alpha and Omega Semiconductor Ltd., Hamilton (BM)

( * ) Notice: Subject to any disclaimer, the term of this patent is extended or adjusted under 35 U.S.C. 154(b) by 0 days.

(21) Appl. No.: 10/896,375

(22) Filed: Jul. 20, 2004

(65) Prior Publication Data
US 2006/0017141 A1    Jan. 26, 2006

(51) Int. Cl.
*H01L 23/495*  (2006.01)
(52) U.S. Cl. ............... 257/666; 257/676; 257/E23.037
(58) Field of Classification Search ............... 257/666, 257/675, 676
See application file for complete search history.

(56) References Cited

U.S. PATENT DOCUMENTS

| | | | | |
|---|---|---|---|---|
| 6,211,462 | B1* | 4/2001 | Carter et al. ............... | 174/52.4 |
| 6,249,041 | B1* | 6/2001 | Kasem et al. ............... | 257/666 |
| 6,396,127 | B1* | 5/2002 | Munoz et al. ............... | 257/666 |
| 6,400,004 | B1* | 6/2002 | Fan et al. ................... | 257/666 |
| 2003/0011051 | A1* | 1/2003 | Woodworth et al. ........ | 257/666 |
| 2005/0145998 | A1* | 7/2005 | Harnden et al. ............ | 257/666 |

* cited by examiner

*Primary Examiner*—Nitin Parekh
(74) *Attorney, Agent, or Firm*—Schein & Cai LLP; Douglas E. Mackenzie; James Cai

(57) ABSTRACT

A semiconductor package including a relatively thick lead frame having a plurality of leads and a first lead frame pad, the first lead frame pad including a die coupled thereto, bonding wires connecting the die to the plurality of leads, the bonding wires being aluminum, and a resin body encapsulating the die, bonding wires and at least a portion of the lead frame.

15 Claims, 14 Drawing Sheets

POWER SEMICONDUCTOR PACKAGE

BACKGROUND OF THE INVENTION

The present invention generally relates to semiconductor devices, more particularly to packaging of semiconductor devices, and more particularly to a package having low electrical resistance and inductance.

Power semiconductor packages have evolved from through hole to surface mounted packages with the evolution of printed circuit board technology. Surface mounted packages generally include a lead frame on which a semiconductor device is mounted. The semiconductor device and a portion of the lead frame are generally encapsulated with a resin material. In a leaded package, lead terminals extend outside the resin body and include bonding pads for providing a wire bond connection from the semiconductor device to the lead terminal.

Major considerations in the packaging of semiconductor devices include high thermal dissipation, low parasitic inductance, low electrical resistance between the semiconductor device and the circuit environment, good reliability in terms of thermal cycling and thermal shock/fatigue, and minimal consumption of circuit board space.

By way of illustration and with reference to FIG. 1, a conventional semiconductor package generally designated 1 includes a lead frame generally designated 7 having a lead frame pad 10 to which is coupled a die 8. A portion of the lead frame 7 may be molded in a resin body 2. In this embodiment, the die 8 embodies a MOSFET device and the lead frame 7 includes a source terminal 18, a gate terminal 26, and a drain terminal 11. Source terminal 18 of the lead frame 7 includes a plurality of separate source lead frame leads 18a external to the resin body 2 and a plurality of separate internal source bonding areas 16 where bonding wires 6 are bonded. Drain terminal 11 includes a plurality of separate drain lead frame leads 11a which are connected to the lead frame pad 10. The gate terminal 26 is connected to an internal gate bonding area 20 which in turn is connected to a gate pad 17 by means of wire 28.

FIG. 2 illustrates a top view of another conventional semiconductor package generally designated 4 including a lead frame generally designated 9. In this embodiment, in lieu of a plurality of separate source bonding areas 16 as shown in FIG. 1, the source bonding areas 16 are joined to form a single source bonding area 30 for bonding wires 6 to die 8. As with the embodiment of FIG. 1, the separate source lead frame leads 18a and the separate lead frame drain leads 11a are separate narrow metal strips that radiate externally from the resin body 2 and are adapted to be inserted into the same receptacle location on a printed circuit board as the device shown in FIG. 1.

Similar to the embodiment of FIG. 1, the lead frame 9 has die 8 disposed thereon and provides a generally narrow border frame around the perimeter of die 8. Moreover, the bonding area 20 of gate 26 is coupled via wire 28 to gate pad 17 formed at a nearest corner. In the prior art embodiment, the source and gate bonding areas 16, 30 and 20 respectively share the same left side of the die 8. Likewise, the source leads 18a and the gate lead 26 radiate from the same left side.

With reference to FIG. 3, a cross sectional view of a conventional semiconductor package such as semiconductor package 1 is shown. Die 8 is shown having a top surface 22 to which bonding wire 6 is coupled. Die 8 may be coupled to lead frame pad 10 by means of conventional material 32. As is conventional in the art, lead frame generally designated 7 has a thickness of about 8 mils requiring that bonding wires 6 be made from gold or copper. Furthermore, source bonding area 16 is conventionally disposed above top surface 22 requiring a relatively long bonding wire 6. As is well known in the art, long bonding wires 6 generally provide for increased electrical resistance and source inductance, particularly in high frequency applications.

Referring now to FIG. 4, a top view of a conventional dual-die semiconductor package generally designated 5 having a lead frame generally designated 13 is shown. The dual-die semiconductor package 5 includes a pair of dies 40a and 40b mounted on a lead frame pad 42 and molded in a resin body 2. A first source terminal 48a includes a first source terminal bonding area 46a distributed along a left side of the first die 40a. The first source terminal bonding area 46a is connected to the first die 40a via bonding wires 41a. A first gate terminal 44a includes a first gate bonding area 43a that shares the left side of the first die 40a and is connected to the first die 40a via bonding wire 45a. A plurality of first drain terminals 47a are coupled to lead frame pad 42.

A second source terminal 48b includes a second source terminal bonding area 46b distributed along a left side of the second die 40b. The second source terminal bonding area 46b is connected to the second die 40b via bonding wires 41b. A second gate terminal 44b includes a second gate bonding area 43b that shares the left side of the second die 40b and is connected to the second die 40b via bonding wire 45b. A plurality of second drain terminals 47b are coupled to lead frame pad 42.

With reference to FIG. 5, a semiconductor package generally designated 50 is shown. Semiconductor package 50 is described in commonly assigned application Ser. No. 10/189,333 which is incorporated herein in its entirety by reference. Semiconductor package 50 includes a lead frame generally designated 51 having an "L" shaped source bonding area 52. The "L" shaped source bonding area 52 provides for an increase in the number of source bonding wires 53 interconnecting a source lead 54 with a die 55. Additionally, the distance between bonding wires 53 is not compromised thereby providing lower electrical resistance and inductance.

A prior art leaded package is disclosed in U.S. Pat. No. 6,291,262 entitled "Surface Mount TO-220 Package and Process for the Manufacture Thereof". The disclosed package includes leads which are bent within the molded housing and formed prior to molding the housing around the lead frame. The bend is located inside the package body to minimize mechanical stresses on the package body. A lead frame is formed of a material having a single gauge.

Another prior art leaded package is disclosed in U.S. Pat. No. 6,211,462 entitled "Low Inductance Power Package for Integrated Circuits". The package includes a flat lead frame with internal leads formed upward to be in very close proximity to the lead frame pad. The external leads are flat and extend beyond the package edge so that good solder connections to a printed circuit board can be made and inspected.

As can be seen, there remains a need in the art for a semiconductor package that minimizes electrical resistance and inductance. Such a semiconductor package also preferably allows for reduced package height and improved thermal resistance properties.

SUMMARY OF THE INVENTION

In accordance with one aspect of the invention, a semiconductor package includes a relatively thick lead frame having a plurality of leads and a first lead frame pad, the first lead frame pad including a die coupled thereto, bonding wires connecting the die to the plurality of leads, the bonding wires being aluminum, and a resin body encapsulating the die, bonding wires and at least a portion of the lead frame.

In accordance with another aspect of the invention, a semiconductor package includes a relatively thick lead frame having a plurality of leads and a pair of lead frame pads, each lead frame pad including a die coupled thereto, bonding wires connecting each die to the plurality of leads, the bonding wires being aluminum, and a resin body encapsulating the die, bonding wires and at least a portion of the lead frame.

In accordance with yet another aspect of the invention, a semiconductor package housing an electronic device includes a relatively thick lead frame having a thickness greater than 8 mils and including a plurality of leads and a lead frame pad, the lead frame pad having the electronic device coupled thereto, bonding wires connecting the electronic device to the plurality of leads, the bonding wires being aluminum wires having a thickness up to 20 mils, and a resin body encapsulating the electronic device, bonding wires and at least a portion of the lead frame.

These and other features, aspects and advantages of the present invention will become better understood with reference to the following drawings, description and claims.

DETAILED DESCRIPTION OF THE INVENTION

The following detailed description is of the best modes of carrying out the invention. The description is not to be taken in a limiting sense, but is made merely for the purpose of illustrating the general principles of the invention, since the scope of the invention is best defined by the appended claims.

The present invention generally provides a semiconductor package having a lead frame formed of a single gauge material having a thickness greater than the conventional 8 mils. Advantageously, a thicker lead frame facilitates the bonding of larger diameter aluminum bonding wires. The use of aluminum bonding wires decreases package resistance dramatically over conventional gold wire configurations. Bonding wires may be up to 20 mils in diameter. A thicker lead frame material further provides for improved package thermal behavior by facilitating heat flow laterally out a drain lead. This is so even in a case where a bottom portion of lead frame pad is exposed. Further, a source bonding area and a gate bonding area may be disposed at a substantially same height as a height of a die. In this manner, a short length of bonding wires may be used to thereby reduce electrical resistance and inductance.

Figure 1:
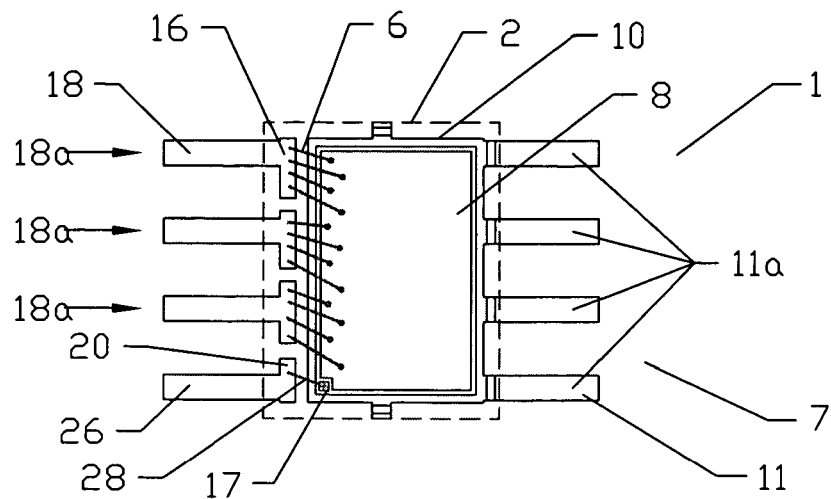
FIG. 1 is top view of a prior art semiconductor package.
Figure 2:
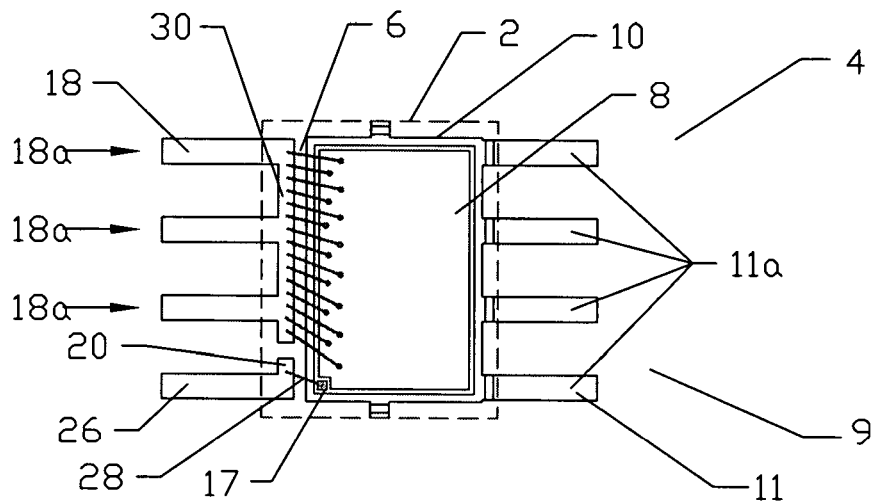
FIG. 2 is top view of another prior art semiconductor package.
Figure 3:
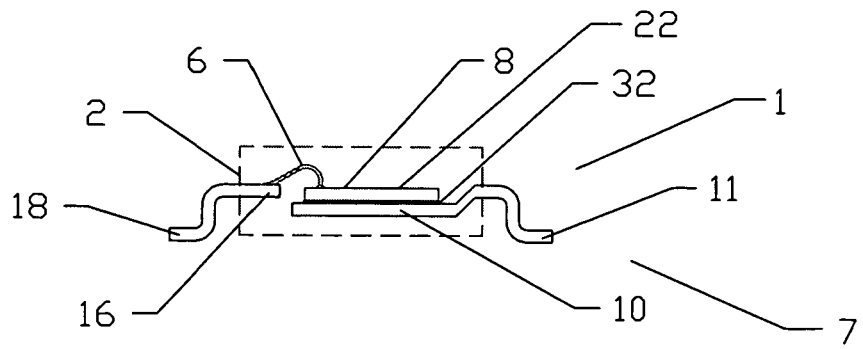
FIG. 3 is a cross sectional view of a conventional semiconductor package.
Figure 4:
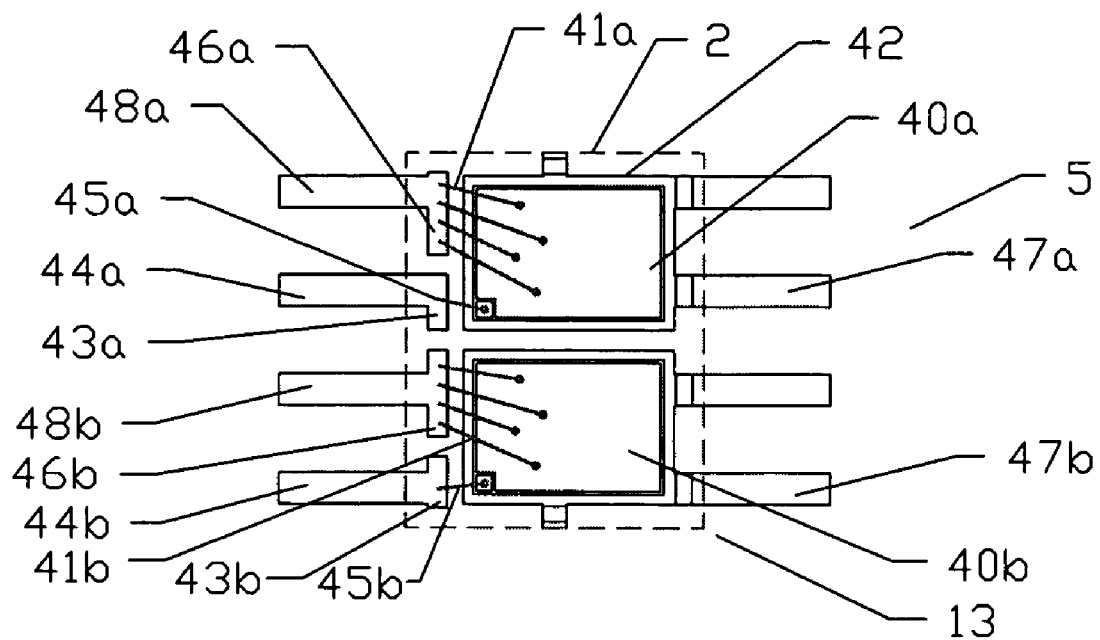
FIG. 4 is a top view of a prior art dual-die semiconductor package.
Figure 5:
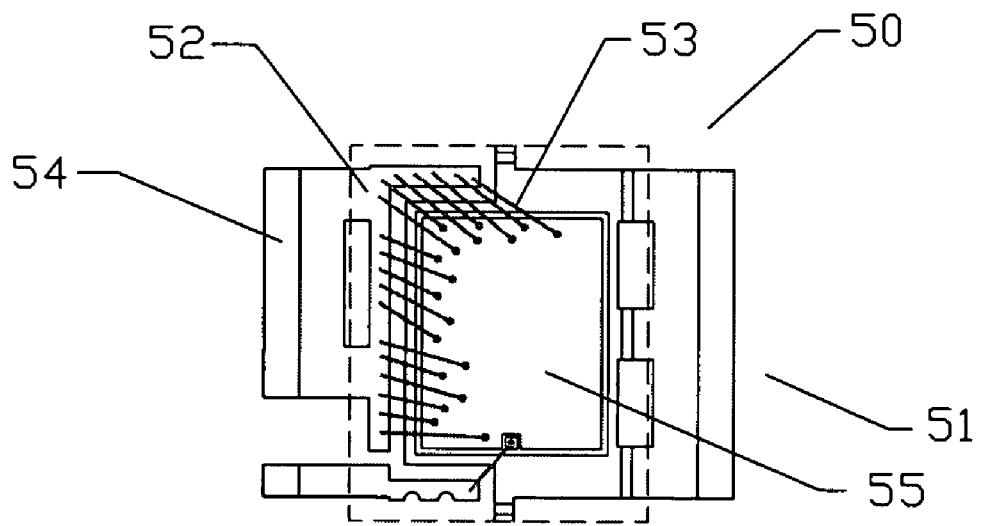
FIG. 5 is a top view of a prior art semiconductor package.
Figure 6A:
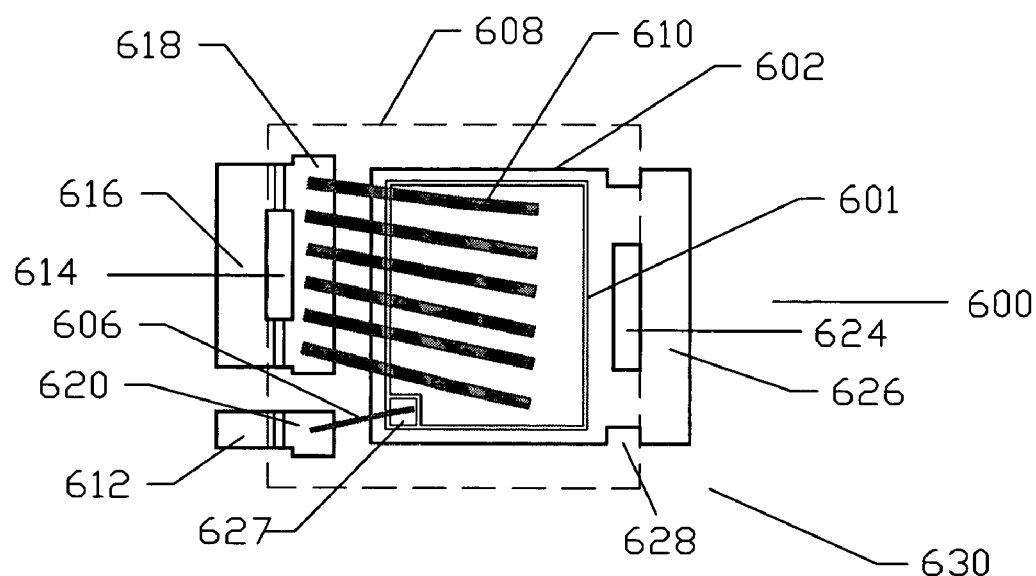
FIG. 6A is a top view of a semiconductor package in accordance with the present invention.

With reference to FIG. 6A, a semiconductor package generally designated 600 may include a lead frame generally designated 630 having a lead frame pad 602 to which may be coupled a die 601. A portion of the lead frame 630 may be molded in a resin body 608. The lead frame 630 may include a source lead 616, a gate lead 612, and a drain lead 626. Source lead 616 may be disposed externally of resin body 608 and coupled to an internal source bonding area 618 which in turn may be coupled to a device source (not shown) by means of bonding wires 610. Source lead 616 may be formed as a single lead to facilitate the use of a maximum number of bonding wires 610 to thereby reduce on-resistance and inductance. Drain lead 626 may be connected to the lead frame pad 602. Gate lead 612 may be connected to an internal gate bonding area 620 which in turn may be connected to a gate pad 627 by means of wire 606. A source locking hole 614 and a drain locking hole 624 may be formed in source lead 616 and drain lead 626 respectively. Locking notches 628 may be formed in drain lead 626.

Figure 6B:
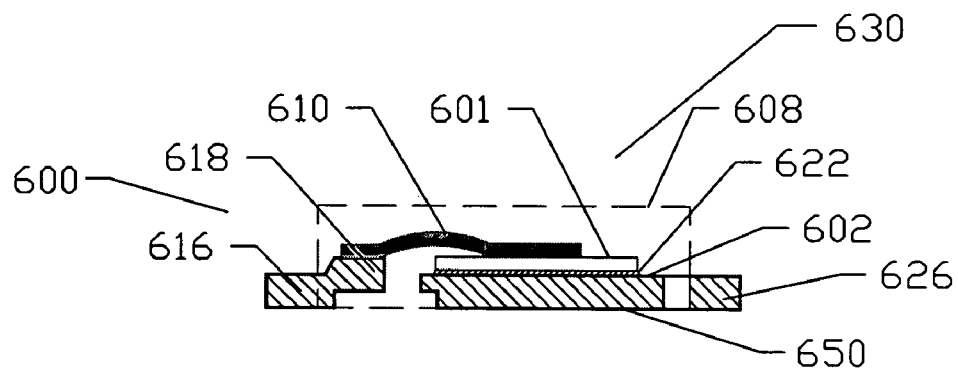
FIG. 6B is a cross sectional view of the semiconductor package of FIG. 6A in accordance with the present invention.
Figure 6C:
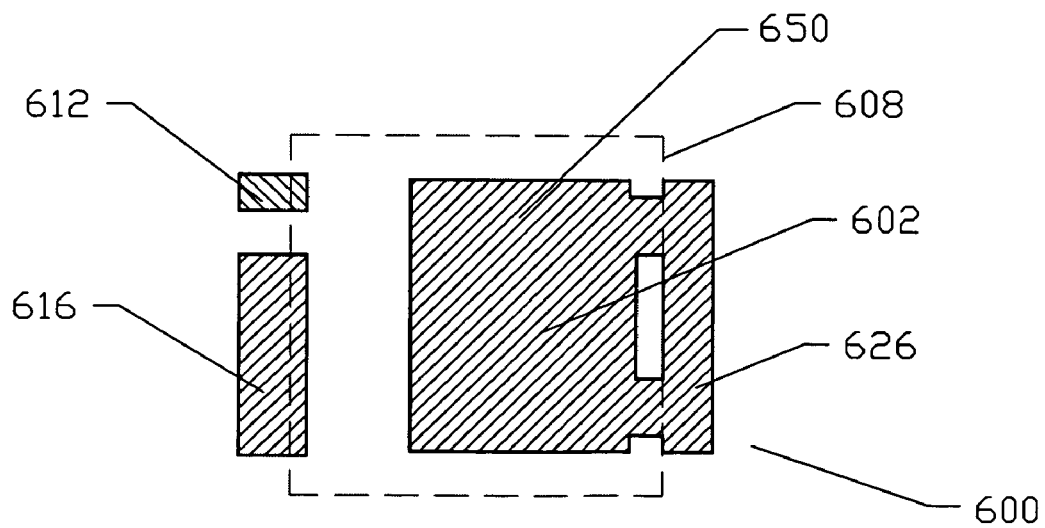
FIG. 6C is a bottom view of the semiconductor package of FIG. 6A in accordance with the present invention.

With reference to FIG. 6B, lead frame 630 may be formed of a single gauge material having a thickness greater than the conventional 8 mils. Advantageously, a thicker lead frame 630 facilitates the bonding of larger diameter aluminum bonding wires 610 and 606 and/or a greater number of bonding wires 610 and 606. The use of aluminum bonding wires 610 and 606 decreases package inductance and resistance dramatically over conventional gold wire configurations. Bonding wires 610 and 606 may be up to 20 mils in diameter. A thicker lead frame material further provides for improved package thermal behavior by facilitating heat flow laterally out drain lead 626. This is so even in a case where a bottom portion 650 of lead frame pad 602 is exposed as shown in FIG. 6C.

With continued reference to FIG. 6B, source bonding area 618 and gate bonding area 620 (not shown) may be disposed at a substantially same height as a height of die 601. In this manner, a short length of bonding wires 610 and 606 may be used to thereby reduce electrical resistance and inductance.

Figure 7A:
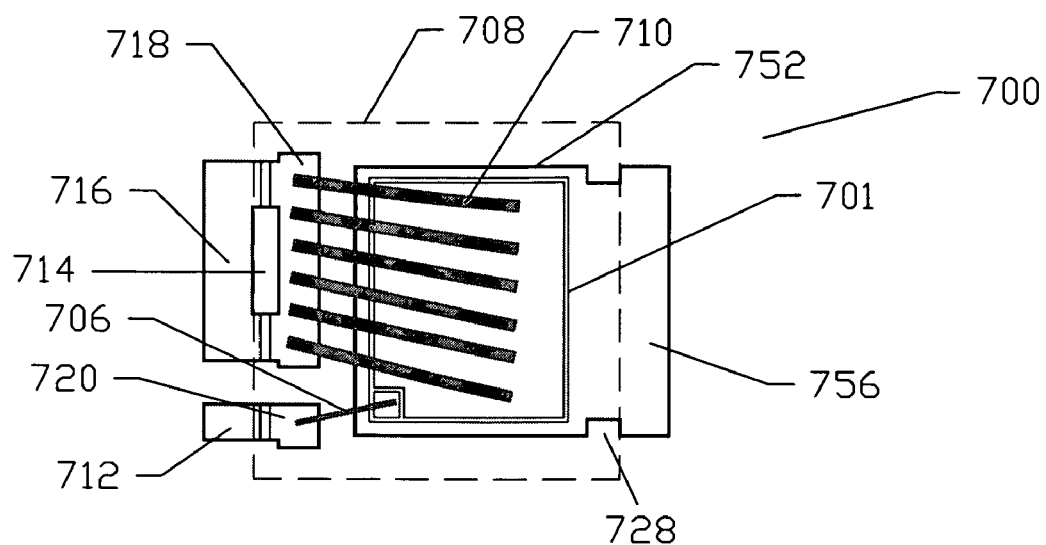
FIG. 7A is a top view of an alternative embodiment of a semiconductor package in accordance with the present invention.
Figure 7B:
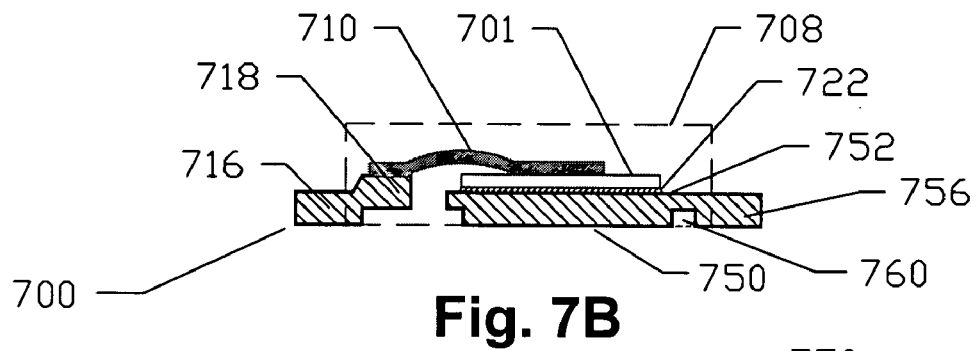
FIG. 7B is a cross sectional view of the semiconductor package of FIG. 7A in accordance with the present invention.
Figure 7C:
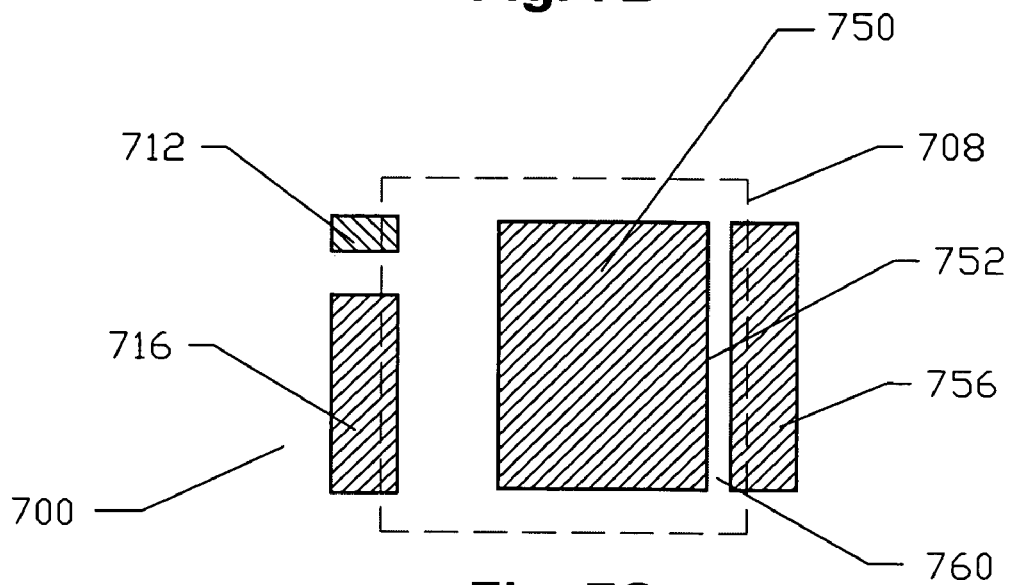
FIG. 7C is a bottom view of the semiconductor package of FIG. 7A in accordance with the present invention.

With reference to FIG. 7A, FIG. 7B, and FIG. 7C, a second alternative embodiment of the present invention generally designated 700 is shown. A die 701 may be bonded to a lead frame pad 752. Source lead 716 and gate lead 712 may be configured in similar fashion to source lead 616 and gate lead 612 as in the embodiment shown in FIG. 6A. A source locking hole 714 may be formed in source lead 716. A drain lead 756 may be connected to lead frame pad 752. Locking notches 728 may be formed in drain 756 to secure leadframe 752 to resin body 708. A notch 760 may be formed along a length of drain lead 756 on a bottom portion 750 of lead frame pad 752. This embodiment advantageously provides for a means of holding the semiconductor package 700 during solder reflow. Lower inductance and resistance is achieved in the embodiment by straight current flow through drain lead 756 and thick and/or a greater number of bonding wires 710 and 706. As in the embodiment shown in FIG. 6, high heat dissipation is achieved by exposed bottom portion 750.

Figure 8A:
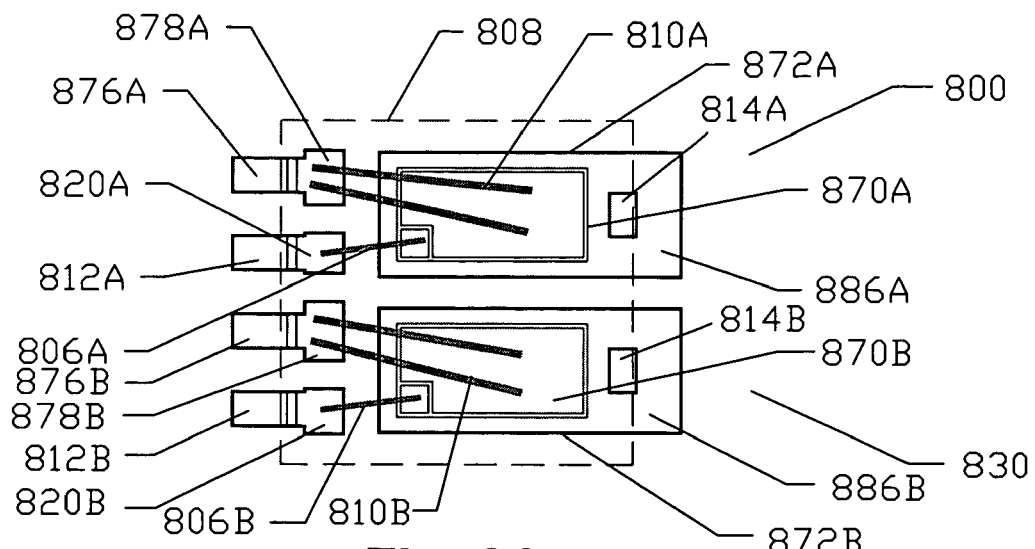
FIG. 8A is a top view of an alternative embodiment of a semiconductor package in accordance with the present invention.
Figure 8B:
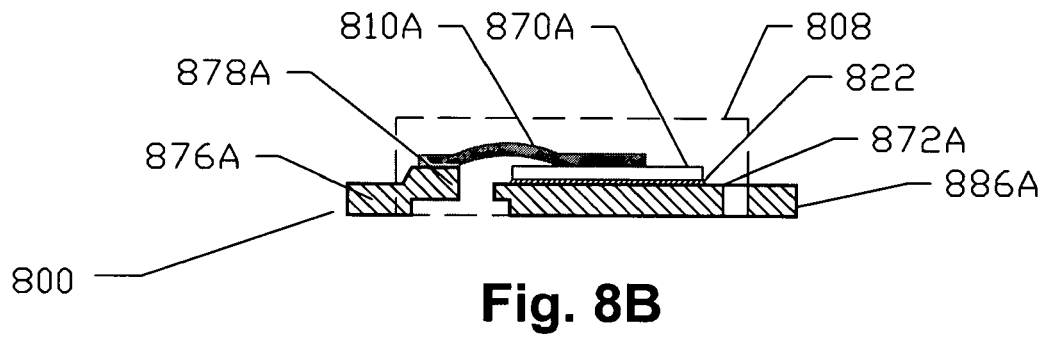
FIG. 8B is a cross sectional view of the semiconductor package of FIG. 8A in accordance with the present invention.
Figure 8C:
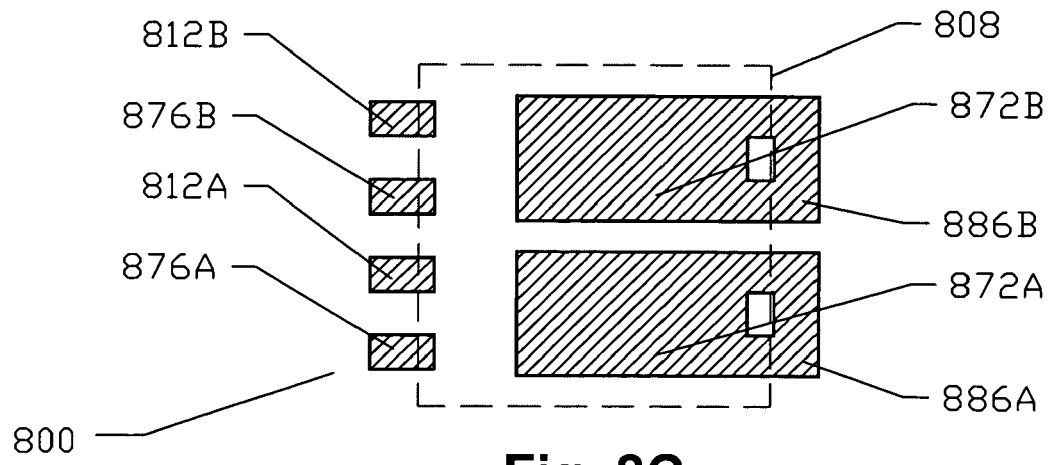
FIG. 8C is a bottom view of the semiconductor package of FIG. 8A in accordance with the present invention.

A third alternative embodiment of the present invention generally designated 800 including a lead frame generally designated 830 is shown in FIG. 8A, FIG. 8B, and FIG. 8C. Semiconductor package 800 may be implemented as an isolated dual die device. A pair of lead frame pads 872A and 872B may be provided, each lead frame pad 872A and 872B having bonded thereto devices 870A and 870B respectively. Leadframe 830 may include a source lead 876A, a gate lead 812A, and drain lead 886A. Leadframe 830 may further include a source lead 876B, a gate lead 812B, and drain lead 886B. Locking holes 814A and 814B may be formed in drain lead 886A and 886B respectively. As shown in FIG. 8B, semiconductor package 800 may include a lead frame 830 formed of a single gauge material having a thickness greater than the conventional 8 mils. A thicker lead frame 830 advantageously provides for reduced package resistance and inductance as described with reference to semiconductor package 600. Additionally source bonding pads 878A and 878B and gate bonding pads 820A and 820B may be disposed at a substantially same height as a height of dice 870A and 870B. In this manner, a short length of bonding wires 810A, 806A, 810B, and 806B may be used to thereby reduce electrical resistance and inductance.

Figure 9A:
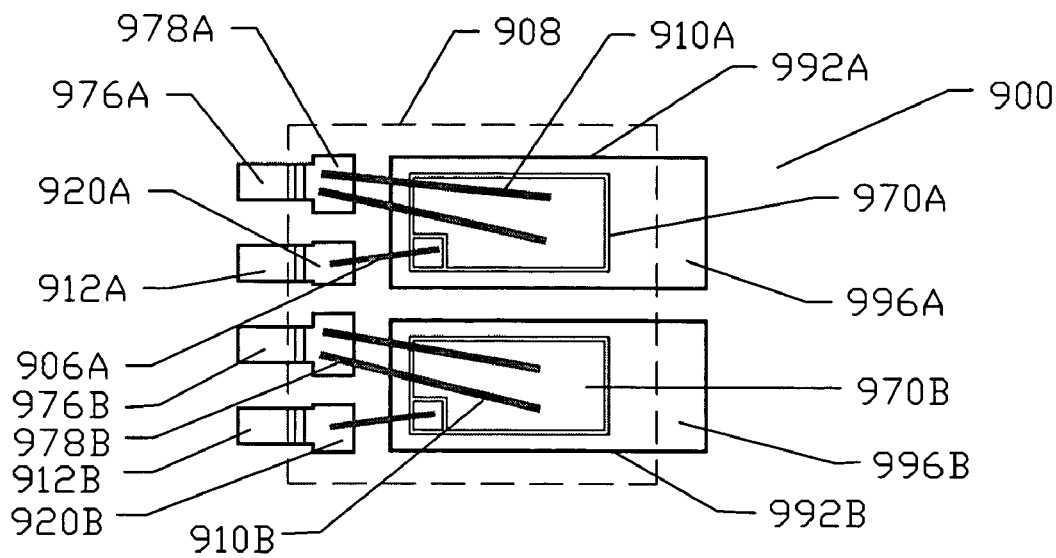
FIG. 9A is a top view of an alternative embodiment of a semiconductor package in accordance with the present invention.
Figure 9B:
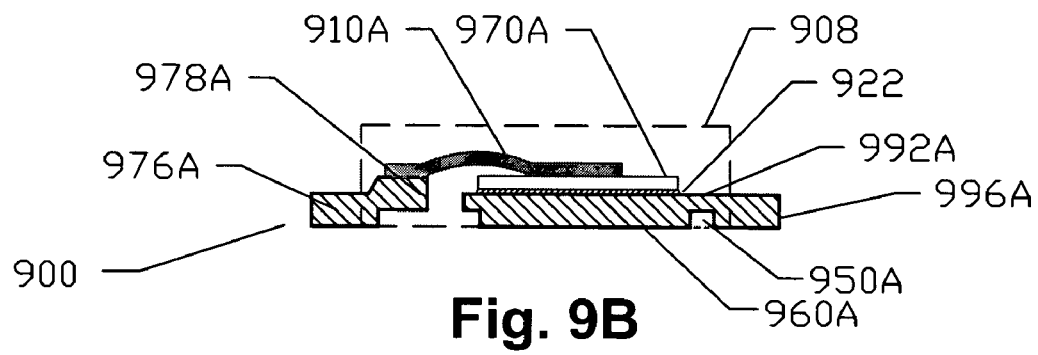
FIG. 9B is a cross sectional view of the semiconductor package of FIG. 9A in accordance with the present invention.
Figure 9C:
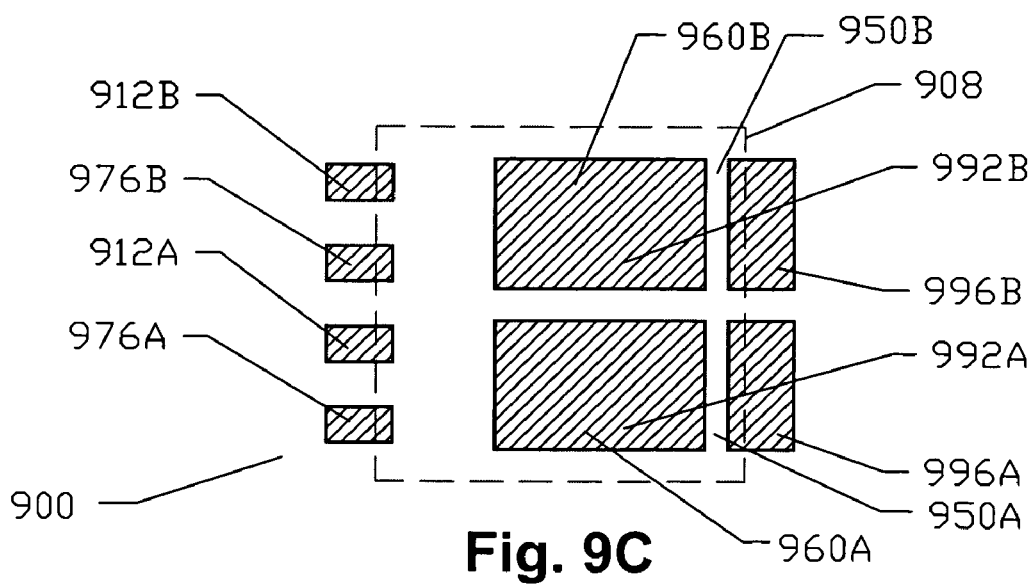
FIG. 9C is a bottom view of the semiconductor package of FIG. 9A in accordance with the present invention.

A fourth alternative embodiment of the present invention generally designated 900 is shown in FIG. 9A, FIG. 9B, and FIG. 9C. In contrast to semiconductor package 800, semiconductor package 900 may include a notch 950A formed along a length of lead frame pad 992A on a bottom surface 960A thereof and a notch 950B formed along a length of lead frame pad 992B on a bottom surface 960B thereof. As noted with reference to semiconductor package 700, notches 950A and 950B may provide for a means of holding the semiconductor package 900 during solder reflow. Lower inductance and resistance is achieved in the embodiment by straight current flow through drain leads 996A and 996B.

Figure 10A:
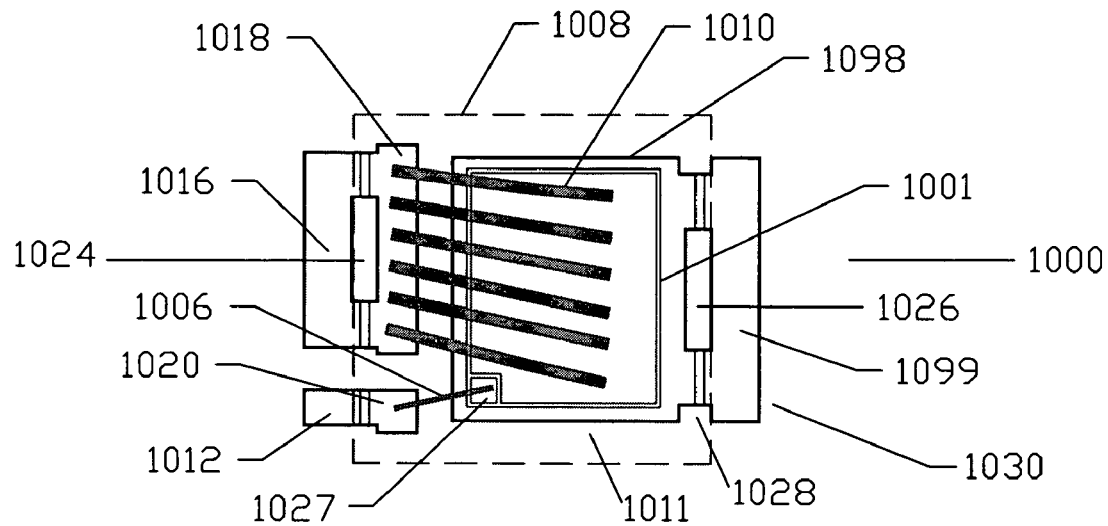
FIG. 10A is a top view of an alternative embodiment of a semiconductor package in accordance with the present invention.
Figure 10B:
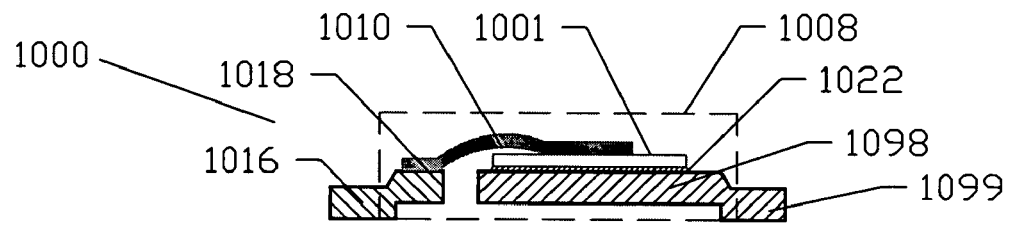
FIG. 10B is a cross sectional view of the semiconductor package of FIG. 10A in accordance with the present invention.
Figure 10C:
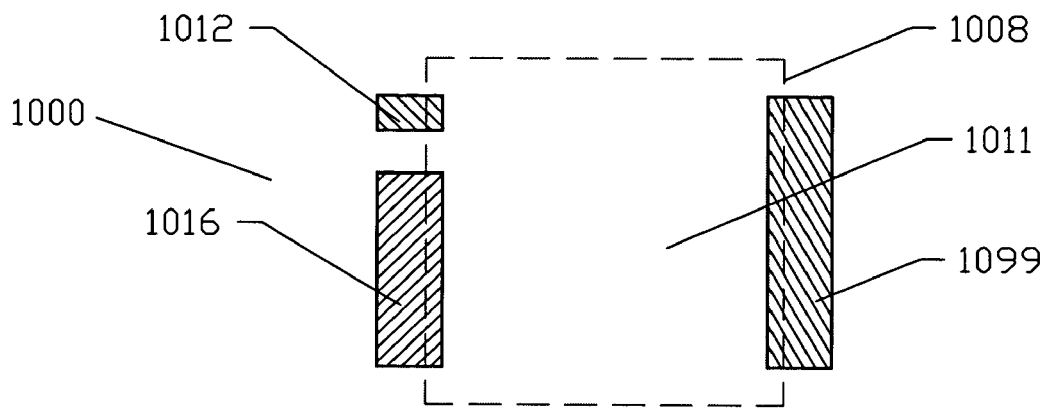
FIG. 10C is a bottom view of the semiconductor package of FIG. 10A in accordance with the present invention.

With reference to FIG. 10A, FIG. 10B, and FIG. 10C, a fifth alternative embodiment of the present invention generally designated 1000 is shown. Semiconductor package 1000 may include a lead frame generally designated 1030 having a lead frame pad 1098 to which may be coupled a die 1001. A portion of the lead frame 1030 may be molded in a resin body 1008. The lead frame 1030 may include a source lead 1016, a gate lead 1012, and a drain lead 1099. Source lead 1016 may be disposed externally of resin body 1008 and coupled to an internal source bonding area 1018 which in turn may be coupled to a device source (not shown) by means of bonding wires 1010. Drain lead 1099 may be connected to the lead frame pad 1098. Gate lead 1012 may be connected to an internal gate bonding area 1020 which in turn may be connected to a gate pad 1027 by means of wire 1006. A source locking hole 1024 and a drain locking hole 1026 may be formed in source lead 1016 and drain lead 1099 respectively. Locking notches 1028 may be formed in drain lead 1099. With particular reference to FIG. 10B and FIG. 10C, a bottom portion 1009 of lead frame pad 1098 may be encapsulated in resin body 1008 by resin portion 1011.

Lead frame 1030 may be formed of a single gauge material having a thickness greater than the conventional 8 mils. A thicker lead frame 1030 advantageously provides for reduced package resistance and inductance as described with reference to semiconductor package 600. Additionally source bonding area 1018 and gate bonding area 1020 may be disposed at a substantially same height as a height of die 1001. In this manner, a short length of bonding wires 1010 and 1006 may be used to thereby reduce electrical resistance and inductance.

Figure 11A:
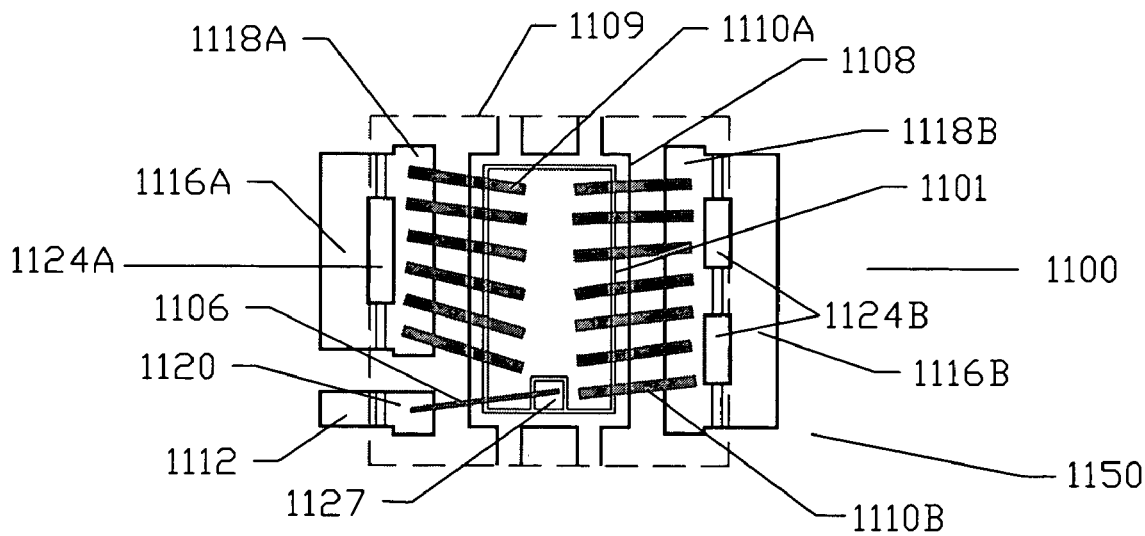
FIG. 11A is a top view of an alternative embodiment of a semiconductor package in accordance with the present invention.
Figure 11B:
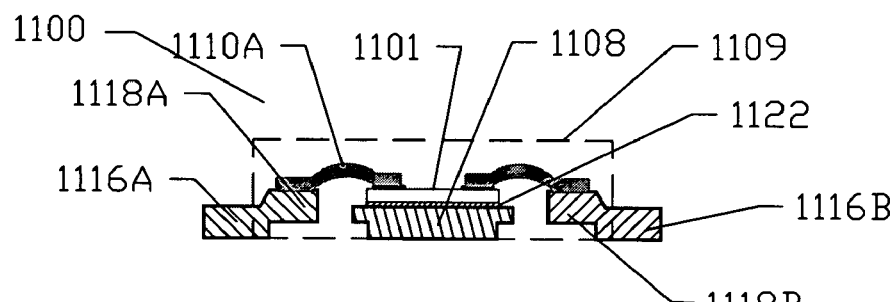
FIG. 11B is a cross sectional view of the semiconductor package of FIG. 11A in accordance with the present invention.
Figure 11C:
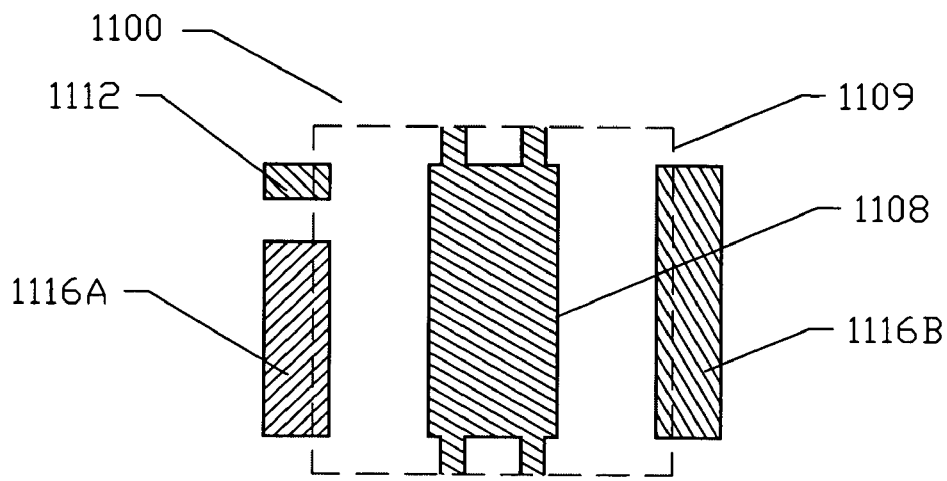
FIG. 11C is a bottom view of the semiconductor package of FIG. 11A in accordance with the present invention.

A sixth alternative embodiment of the present invention generally designated 1100 is shown in FIG. 11A, FIG. 11B, and FIG. 11C. Semiconductor package 1100 may include a lead frame generally designated 1150. Lead frame 1150 may include a lead frame pad 1108 having a die 1101 coupled thereto. A portion of lead frame 1150 may be molded in resin body 1109. The lead frame 1150 may include a pair of source leads 1116A and 1116B, a gate lead 1112, and a drain lead comprising the lead frame pad 1108. Source leads 1116A and 116B may be disposed opposite one another and externally of resin body 1109 and coupled to internal source bonding areas 1118A and 1118B which in turn may be coupled to a device source (not shown) by means of bonding wires 1110A and 1110B. Gate lead 1112 may be connected to internal gate bonding area 1120 which in turn may be connected to a gate pad 1127 by means of bonding wire 1106. A source locking hole 1124A may be formed in source lead 1116A and source locking holes 1124B may be formed in source lead 1116B.

Lead frame 1150 may be formed of a single gauge material having a thickness greater than the conventional 8 mils. A thicker lead frame 1150 advantageously provides for reduced package resistance and inductance as described with reference to semiconductor package 600. Additionally source bonding areas 1118A and 1118B and gate bonding area 1120 may be disposed at a substantially same height as a height of die 1101. In this manner, a short length of bonding wires 111A, 1110B, and 1106 may be used to thereby reduce electrical resistance and inductance. Further, a greater number of source bonding wires 1110A and 1110B reduces electrical resistance and inductance.

Figure 12A:
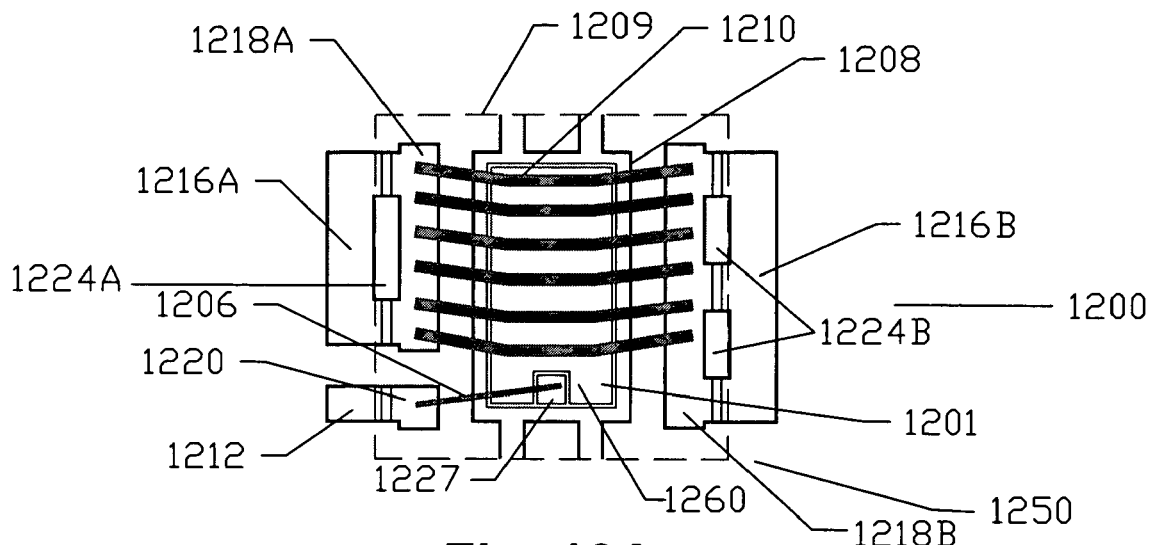
FIG. 12A is a top view of an alternative embodiment of a semiconductor package in accordance with the present invention.
Figure 12B:
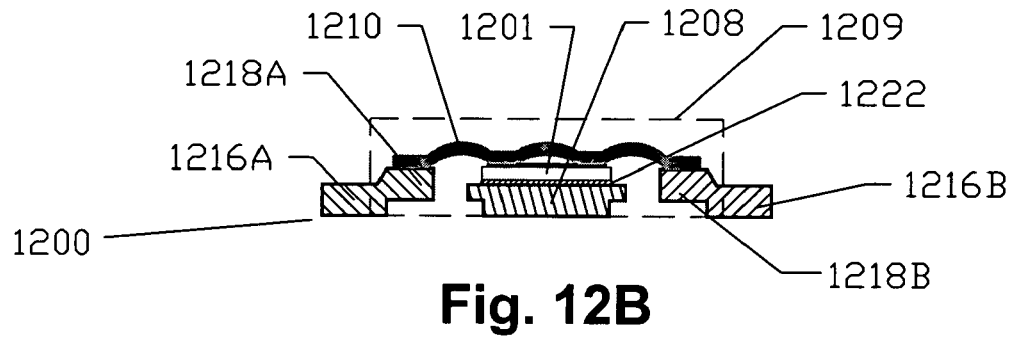
FIG. 12B is a cross sectional view of the semiconductor package of FIG. 12A in accordance with the present invention.
Figure 12C:
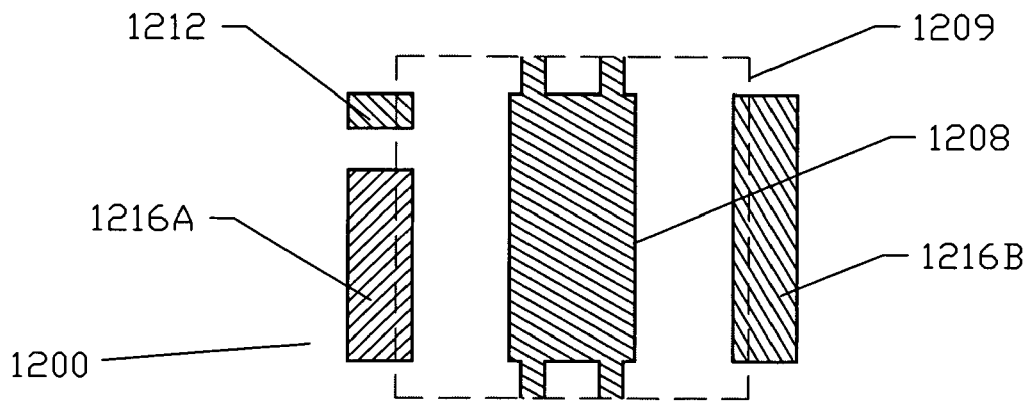
FIG. 12C is a bottom view of the semiconductor package of FIG. 12A in accordance with the present invention.

With reference to FIG. 12A, FIG. 12B, and FIG. 12C, a seventh embodiment of the present invention generally designated 1200 is shown. Semiconductor package 1200 may include a lead frame generally designated 1250. Lead frame 1250 may include a lead frame pad 1208 having a die 1201 coupled thereto. A portion of lead frame 1250 may be molded in resin body 1209. The lead frame 1250 may include a pair of source leads 1216A and 1216B, a gate lead 1212, and a drain lead comprising the lead frame pad 1208. Source leads 1216A and 1216B may be disposed opposite one another and externally of resin body 1209 and stitch bonded to internal source bonding areas 1218A and 1218B which in turn may be stitch bonded to a device source (not shown) by means of bonding wires 1210. Gate lead 1212 may be connected to internal gate bonding area 1220 which in turn may be connected to a gate pad 1227 by means of bonding wire 1206. A source locking hole 1224A may be formed in source lead 1216A and source locking holes 1224B may be formed in source lead 1216B. This embodiment advantageously provides for reduced electrical resistance by reducing metal spreading resistance at a die surface 1260 and providing uniform current distribution.

Lead frame 1250 may be formed of a single gauge material having a thickness greater than the conventional 8 mils. A thicker lead frame 1250 advantageously provides for reduced package resistance and inductance as described with reference to semiconductor package 600. Additionally source bonding areas 1218A and 1218B and gate bonding area 1220 may be disposed at a substantially same height as a height of die 1201. In this manner, a short length of bonding wires 1210 and 1206 may be used to thereby reduce electrical resistance and inductance.

Figure 13:
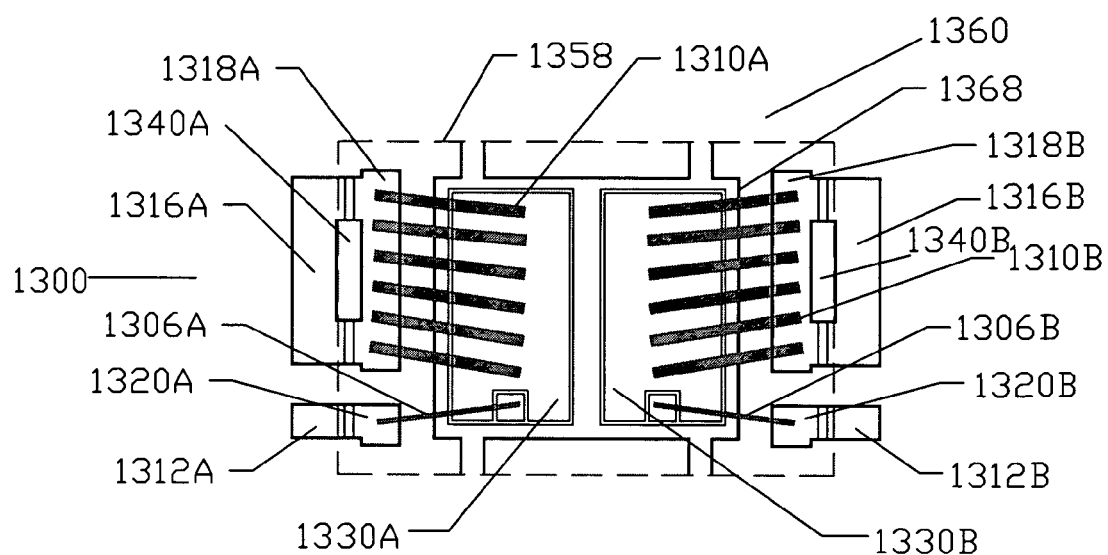
FIG. 13 is a top view of an alternative embodiment of a semiconductor package in accordance with the present invention.

With reference to FIG. 13 an eighth alternative embodiment of the present invention generally designated 1300 is shown. Semiconductor package 1300 may be implemented as a common drain dual die device. Semiconductor package 1300 may include a lead frame generally designated 1360. Lead frame 1360 may include a lead frame pad 1368 having a pair of devices 1330A and 1330B bonded thereto. Device 1330A may include a source lead 1316A, a gate lead 1312A, and shared drain lead comprising lead frame pad 1368. Device 1330B may include a source lead 1316B, a gate lead 1312B, and shared drain lead. Source locking holes 1340A and 1340B may be formed in source leads 1316A and 1316B respectively.

Lead frame 1350 may be formed of a single gauge material having a thickness greater than the conventional 8 mils. A thicker lead frame 1350 advantageously provides for reduced package resistance and inductance as described with reference to semiconductor package 600. Additionally source bonding areas 1318A and 1318B and gate bonding areas 1320A and 1320B may be disposed at a substantially same height as a height of dice 1330A and 1330B. In this manner, a short length of bonding wires 1310A, 1310B, 1306A and 1306B may be used to thereby reduce electrical resistance and inductance. Further a greater number of bonding wires 1310A and 1310B may be used to further reduce electrical resistance and inductance.

Figure 14A:
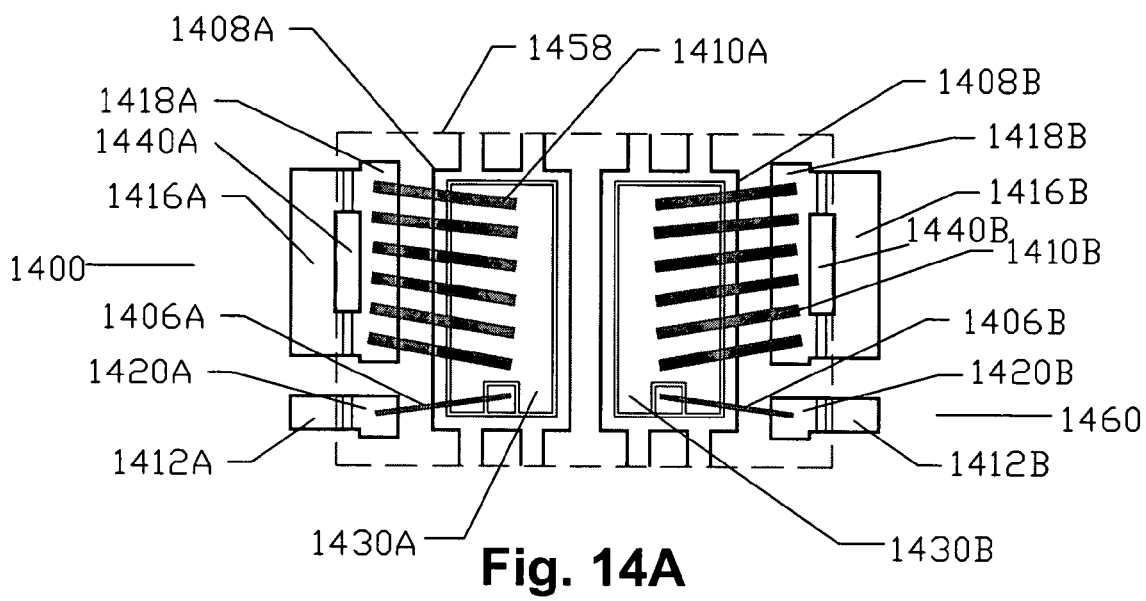
FIG. 14A is a top view of an alternative embodiment of a semiconductor package in accordance with the present invention.
Figure 14B:
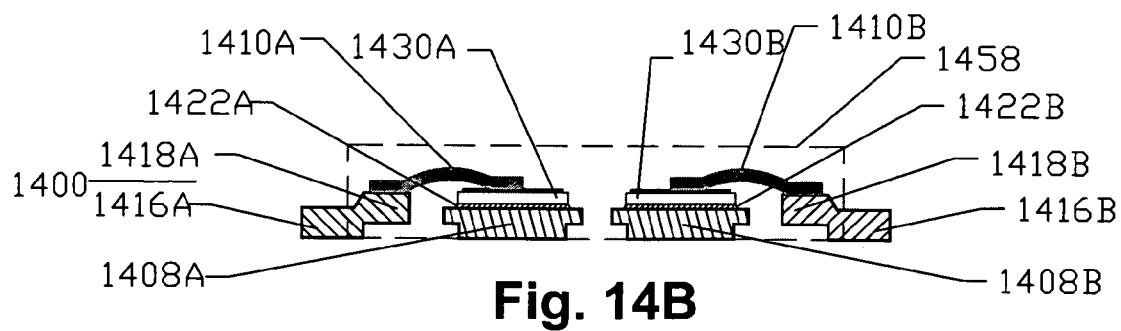
FIG. 14B is a cross sectional view of the semiconductor package of
FIG. 14A in accordance with the present invention.

A ninth alternative embodiment of the present invention generally designated 1400 is shown in FIG. 14A and FIG. 14B. Semiconductor package 1400 may be implemented as a dual die device. Semiconductor package 1400 may include a lead frame generally designated 1460. Lead frame 1460 may include lead frame pads 1408A and 1408B having devices 1430A and 1430B bonded respectively thereto. Leadframe 1460 may include a source lead 1416A, a gate lead 1412A, and a drain lead comprising lead frame pad 1408A. Leadframe 1460 may further include a source lead 1416B, a gate lead 1412B, and a drain lead comprising lead frame pad 1408B. Source locking holes 1440A and 1440B may be formed in source leads 1416A and 1416B respectively.

Lead frame 1460 may be formed of a single gauge material having a thickness greater than the conventional 8 mils. A thicker lead frame 1460 advantageously provides for reduced package resistance and inductance as described with reference to semiconductor package 600. Additionally source bonding areas 1418A and 1418B and gate bonding areas 1420A and 1420B may be disposed at a substantially same height as a height of dice 1430A and 1430B. In this manner, a short length of bonding wires 1410A, 1410B, 1406A and 1406B may be used to thereby reduce electrical resistance and inductance. Further a greater number of bonding wires 1410A and 1410B may be used to further reduce electrical resistance and inductance.

Figure 15:
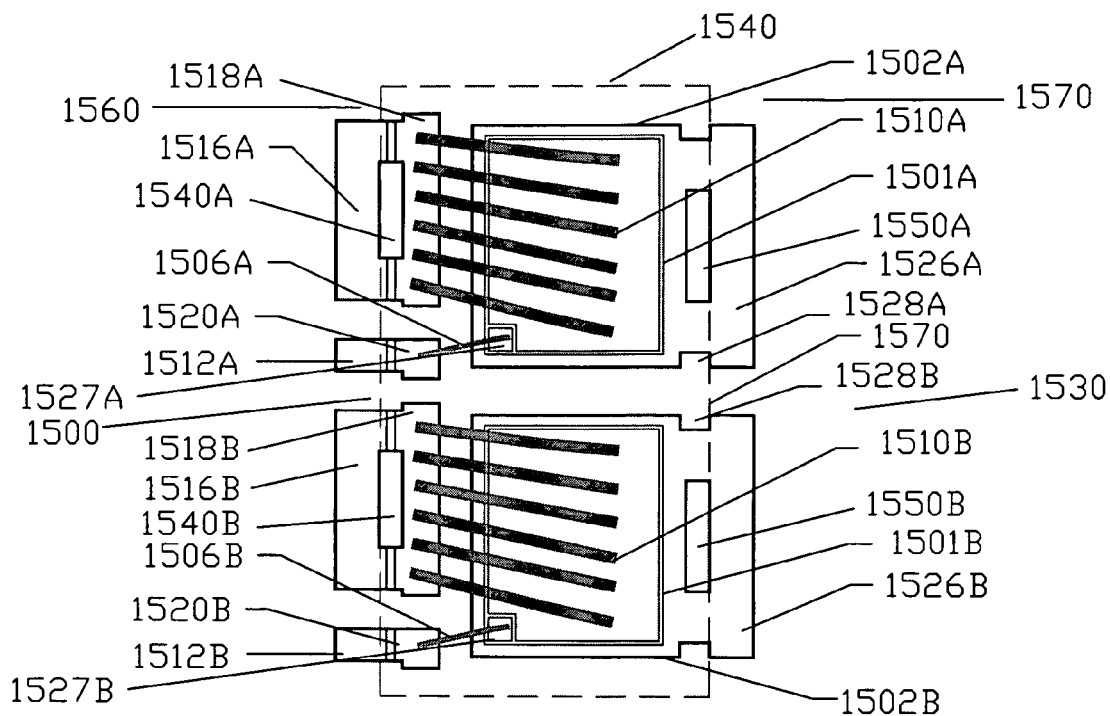
FIG. 15 is a top view of an alternative embodiment of a semiconductor package in accordance with the present invention.

With reference to FIG. 15, a tenth alternative embodiment of the present invention generally designated 1500 is shown. Semiconductor package 1500 may include a large package occupying the footprint of an SO14 to SO20 package. Semiconductor package 1500 may include a lead frame generally designated 1530. Lead frame 1530 may include lead frame pads 1502A and 1502B having devices 1501A and 1501B bonded respectively thereto. Leadframe 1530 may include a source lead 1516A, a gate lead 1512A, and a drain lead 1526A. Leadframe 1530 may further include a source lead 1516B, a gate lead 1512B, and a drain lead 1526B. Source lead 1516A and gate lead 1512A may be disposed on a same first side 1560 of semiconductor package 1500 as source lead 1516B and gate lead 1512B. Drain lead 1526A and drain lead 1526B may be disposed on a second side 1570 of semiconductor package 1500. Source locking holes 1540A and 1540B may be formed in source leads 1516A and 1516B respectively. Drain locking holes 1550A and 1550B may be formed in drain leads 1526A and 1526B respectively. Locking notches 1528A and 1528B may be formed in drain leads 1526A and 1526B respectively. Lead frame 1530 may be formed of a single gauge material having a thickness greater than the conventional 8 mils. A thicker lead frame 1530 advantageously provides for reduced package resistance and inductance as described with reference to semiconductor package 600. Additionally source bonding areas 1518A and 1518B and gate bonding areas 1520A and 1520B may be disposed at a substantially same height as a height of dice 1501A and 1501B. In this manner, a short length of bonding wires 1510A, 1510B, 1506A and 1506B may be used to thereby reduce electrical resistance and inductance.

Figure 16:
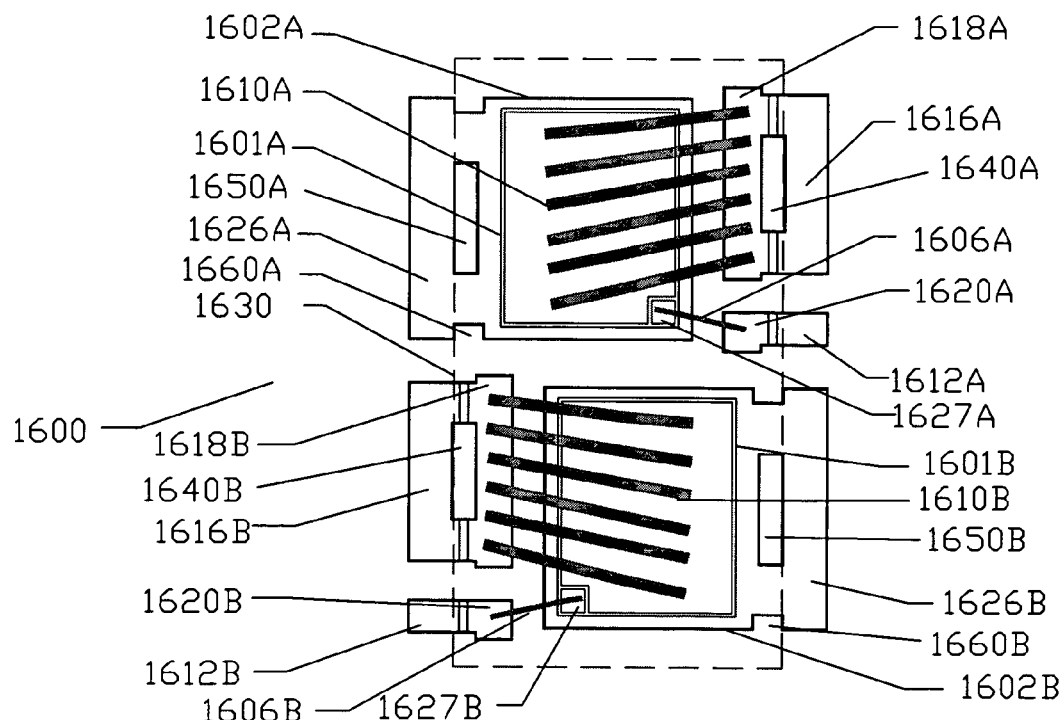
FIG. 16 is a top view of an alternative embodiment of a semiconductor package in accordance with the present invention.

An eleventh alternative embodiment of the present invention generally designated 1600 is shown in FIG. 16. Semiconductor package 1600 may include a large package occupying the footprint of an SO14 to SO20 package. Semiconductor package 1600 may include a lead frame generally designated 1630. Lead frame 1630 may include lead frame pads 1602A and 1602B having devices 1601A and 1601B bonded respectively thereto. Leadframe 1630 may include a source lead 1616A, a gate lead 1612A, and a drain lead 1626A. Leadframe 1630 may further include a source lead 1616B, a gate lead 1612B, and a drain lead 1626B. Source lead 1616A and gate lead 1612A may bed is posed on an opposite side of semiconductor package 1600 from source lead 1616B and gate lead 1612B. Drain lead 1626A may be disposed on an opposite side of semiconductor package 1600 from drain lead 1626B. Source locking holes 1640A and 1640B may be formed in source leads 1616A and 1616B respectively. Drain locking holes 1650A and 1650B may be formed in drain leads 1626A and 1626B respectively. Locking notches 1660A and 1660B may be formed in drain leads 1626A and 1626B respectively. Lead frame 1630 may be formed of a single gauge material having a thickness greater than the conventional 8 mils. A thicker lead frame 1630 advantageously provides for reduced package resistance and inductance as described with reference to semiconductor package 600. Additionally source bonding areas 1618A and 1618B and gate bonding areas 1620A and 1620B may be disposed at a substantially same height as a height of dice 1601A and 1601B. In this manner, a short length of bonding wires 1610A, 1610B, 1606A and 1606B may be used to thereby reduce electrical resistance and inductance.

Figure 17:
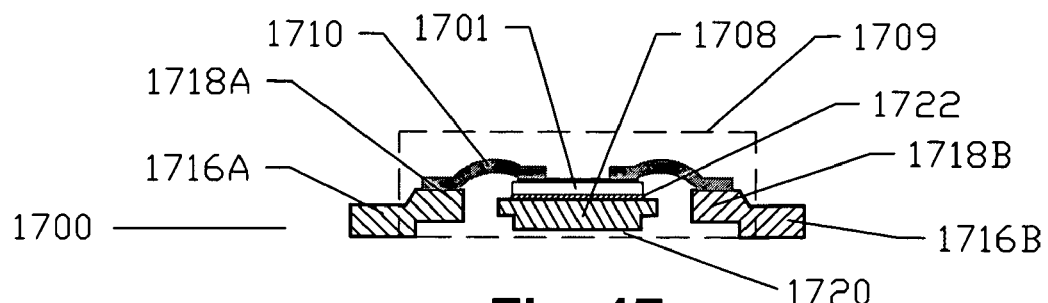
FIG. 17 is a cross sectional view of an alternative embodiment of a semiconductor package in accordance with the present invention.

With reference to FIG. 17, a twelfth alternative embodiment of the present invention generally designated 1700 is shown. Semiconductor package 1700 is similar to semiconductor package 1100 (FIG. 11A, FIG. 11B, and FIG. 11C) except that a bottom portion 1720 of lead frame pad 1708 is encapsulated in resin body 1709.

Figure 18:
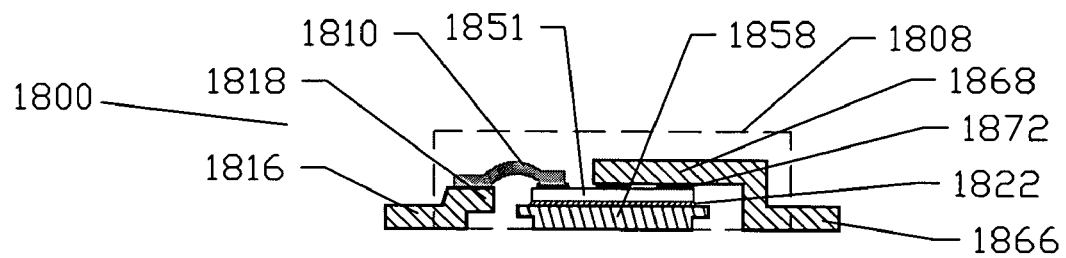
FIG. 18 is a cross sectional view of an alternative embodiment of a semiconductor package in accordance with the present invention.

A thirteenth alternative embodiment of the present invention generally designated 1800 is shown in FIG. 18. Semiconductor package 1800 may include a lead frame pad 1858 having mounted thereon a semiconductor device 1851. A resin body 1808 may encapsulate a portion of a lead frame (not shown). A plurality of contact regions 1872 may be used to connect a lead portion 1868 of lead frame to a device region. Contact regions 1872 may include solder, brazing, Au bump, Ag epoxy, Cu bump or other means of connection. The device region may be a source region in the case of a vertical device and a drain region in the case of a lateral device. A lead 1866 may be coupled to lead portion 1868. A lead 1816 may be coupled to a lead bonding area 1818 which may in turn be coupled to a device region by means of bonding wire 1818. The lead frame may be formed of a single gauge material having a thickness greater than the conventional 8 mils. A thicker lead frame advantageously provides for reduced package resistance and inductance as described with reference to semiconductor package 600. Additionally lead bonding area 1818 may be disposed at a substantially same height as a height of device 1851. In this manner, a short length of bonding wire 1810 may be used to thereby reduce electrical resistance and inductance.

Figure 19:
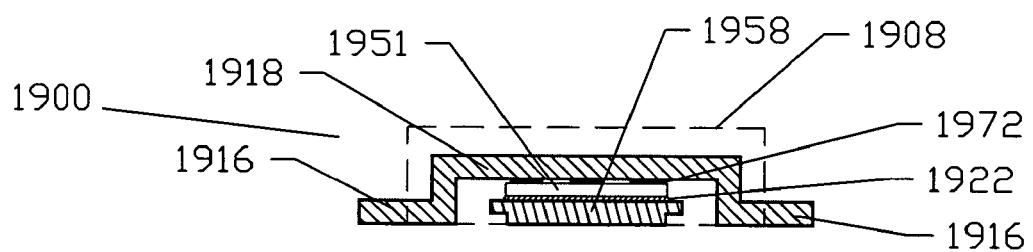
FIG. 19 is a cross sectional view of an alternative embodiment of a semiconductor package in accordance with the present invention.

With reference to FIG. 19, a fourteenth alternative embodiment of the present invention generally designated 1900 is shown. A lead portion 1918 may be connected to a device region (such as a source or drain region) of device 1951 by means of contact regions 1972. Advantageously, package 1900 provides for improved thermal dissipation through leads 1916.

Figure 20:
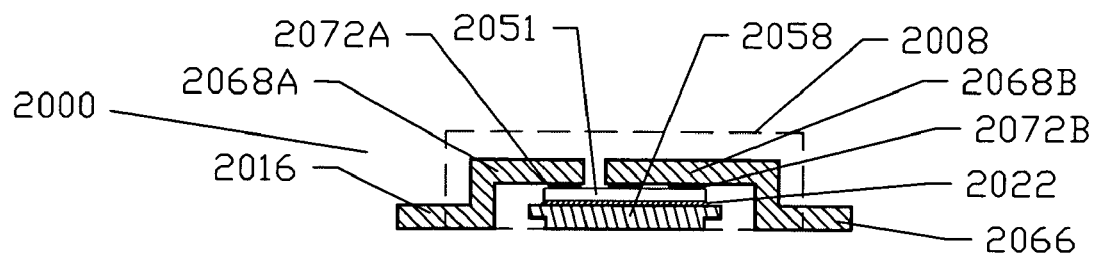
FIG. 20 is a cross sectional view of an alternative embodiment of a semiconductor package in accordance with the present invention.

With reference to FIG. 20, a fifteenth alternative embodiment of the present invention generally designated 2000 is shown. A first lead portion 2068A may be connected to a device region (such as a source or drain region) of device 2051 by means of contact regions 2072A. A second lead portion 2068B may be connected to a device region of device 2051 by means of contact regions 2072B.

Figure 21A:
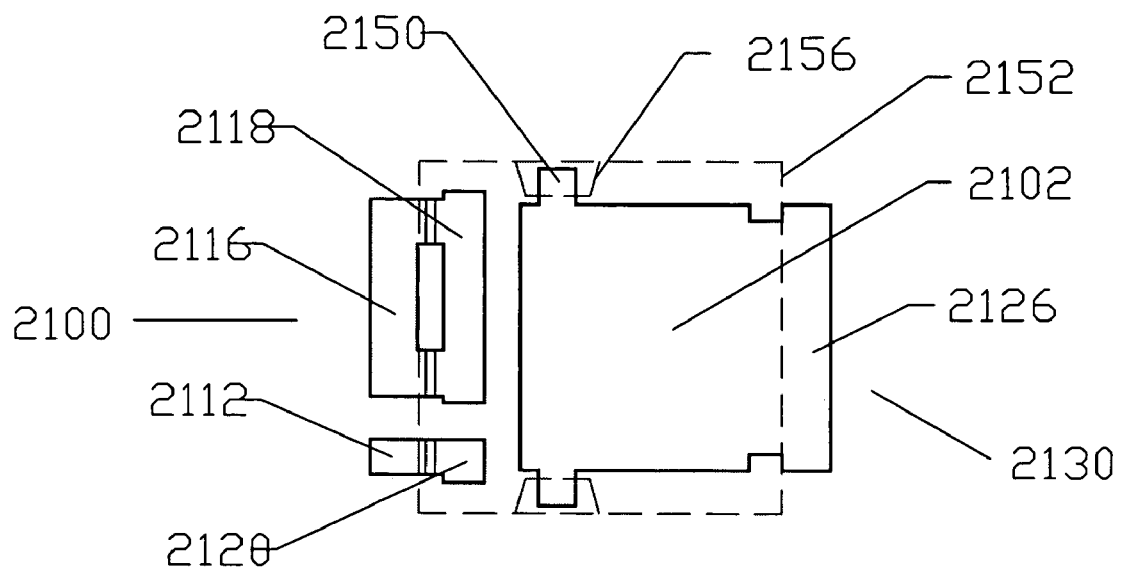
FIG. 21A is a cross sectional view of an alternative embodiment of a semiconductor package in accordance with the present invention.
Figure 21B:
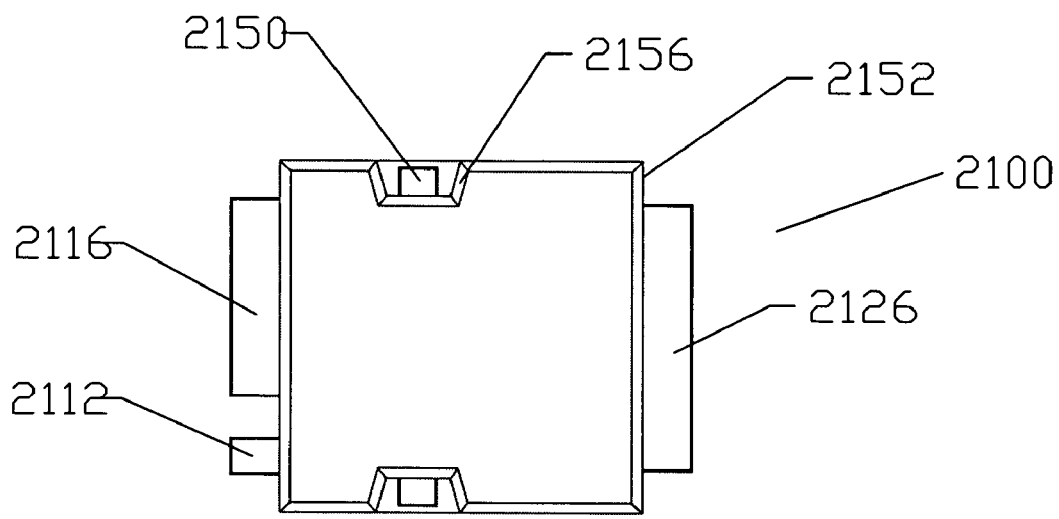
FIG. 21B is a top view of the semiconductor package of FIG. 21A in accordance with the present invention.
Figure 21C:
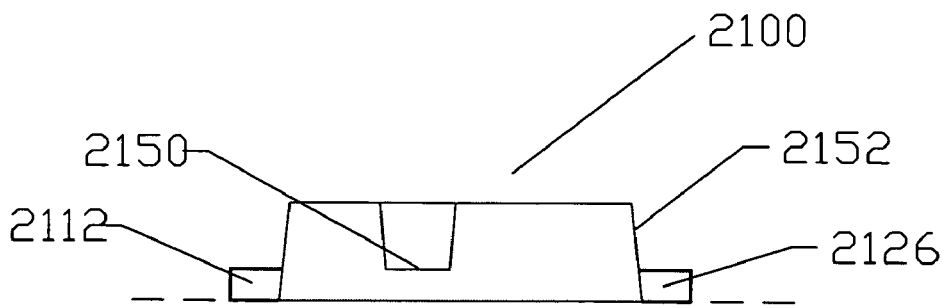
FIG. 21C is a cross sectional view of the semiconductor package of FIG. 21A in accordance with the present invention.

A sixteenth alternative embodiment of the present invention generally designated 2100 is shown in FIG. 21A, FIG. 21B, and FIG. 21C. Semiconductor package 2100 may include a lead frame generally designated 2130. A resin body 2152 may encapsulate a portion of lead frame 2130. Lead frame 2130 may include a source lead 2116, a gate lead 2112, and a drain lead 2126. Drain lead 2126 may include a pair of opposing drain lead portions 2150. Drain lead portions 2150 may be exposed through resin body 2152 by cutouts 2156 to provide for locking of package 2100.

Figure 22A:
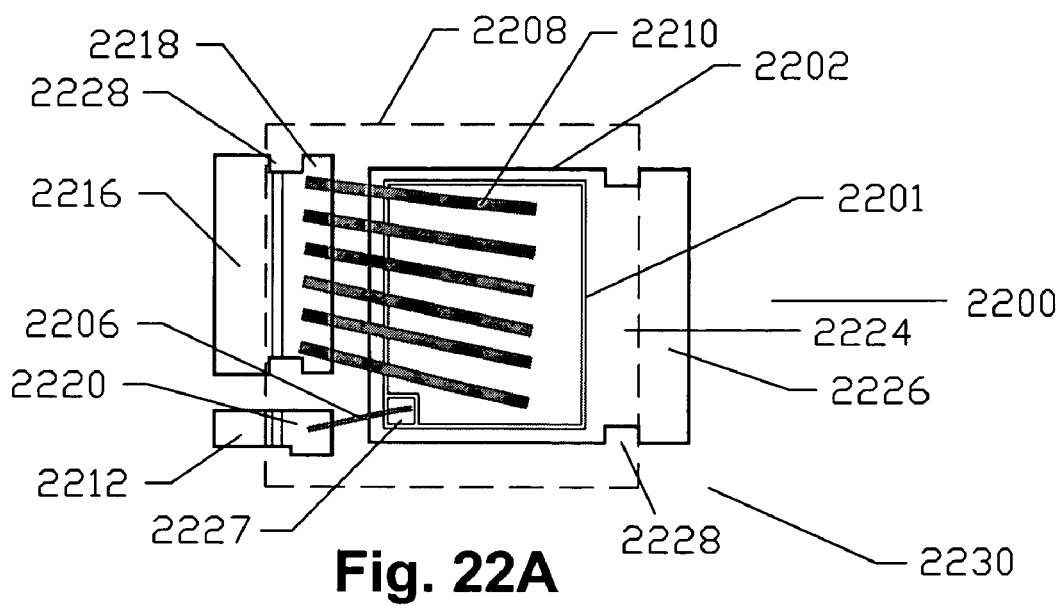
FIG. 22A is a top view of an alternative embodiment of a semiconductor package in accordance with the present invention.
Figure 22B:
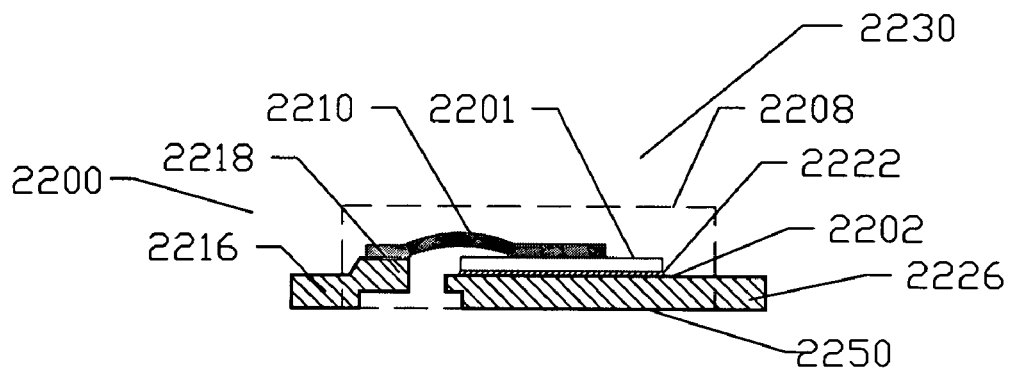
FIG. 22B is a cross sectional view of the semiconductor package of FIG. 22A in accordance with the present invention.
Figure 22C:
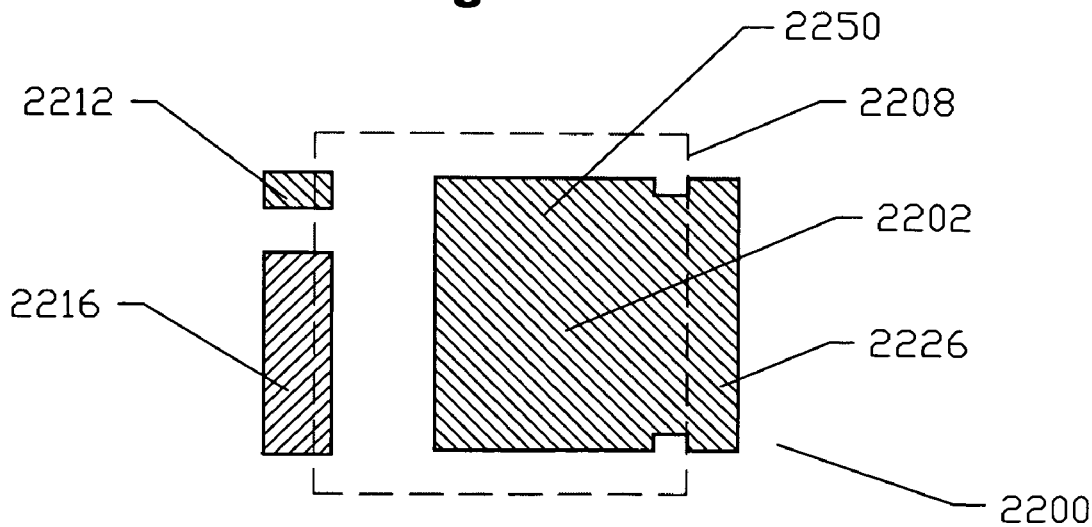
FIG. 22C is a bottom view of the semiconductor package of FIG. 22A in accordance with the present invention.

A seventeenth alternative embodiment of the invention generally designated 2200 is shown in FIG. 22A, FIG. 22B, and FIG. 22C. Semiconductor package 2200 may include a lead frame generally designated 2230 having a lead frame pad 2202 to which may be coupled a die 2201. A portion of the lead frame 2230 may be molded in a resin body 2208. The lead frame 2230 may include a source lead 2216, a gate lead 2212, and a drain lead 2226. Source lead 2216 may be disposed externally of resin body 2208 and coupled to an internal source bonding area 2218 which in turn may be coupled to a device source by means of bonding wires 2210. Source lead 2216 may be formed as a single lead to facilitate the use of a maximum number of bonding wires 2210 to thereby reduce on-resistance and inductance. Drain lead 2226 may be connected to the lead frame pad 2202. Gate lead 2212 may be connected to an internal gate bonding area 2220 which in turn may be connected to a gate pad 2227 by means of bonding wire 2206. Locking notches 2228 may be formed in source lead 2216.

With particular reference to FIG. 22B, lead frame 2230 may be formed of a single gauge material having a thickness greater than the conventional 8 mils. Advantageously, a thicker lead frame 2230 facilitates the bonding of larger diameter aluminum bonding wires 2210 and 2206 and/or a greater number of bonding wires 2210 and 2206. The use of aluminum bonding wires 2210 and 2206 decreases package inductance and resistance dramatically over conventional gold wire configurations. Bonding wires 2210 and 2206 may be up to 20 mils in diameter. A thicker lead frame material further provides for improved package thermal behavior by facilitating heat flow laterally out drain lead 2226. This is so even in a case where a bottom portion 2250 of lead frame pad 2202 is exposed as shown in FIG. 22C.

With continued reference to FIG. 22B, source bonding area 2218 and gate bonding area 2220 (not shown) may be disposed at a substantially same height as a height of die 2201. In this manner, a short length of bonding wires 2210 and 2206 may be used to thereby reduce electrical resistance and inductance.

As will be appreciated by those skilled in the art, the present invention generally provides a semiconductor package having a lead frame formed of a single gauge material having a thickness greater than the conventional 8 mils. Advantageously, a thicker lead frame facilitates the bonding of larger diameter aluminum bonding wires. The use of aluminum bonding wires decreases package resistance dramatically over conventional gold wire configurations. Bonding wires may be up to 20 mils in diameter. A thicker lead frame material further provides for improved package thermal behavior by facilitating heat flow laterally out a drain lead. This is so even in a case where a bottom portion of lead frame pad is exposed. Further, a source bonding area and a gate bonding area may be disposed at a substantially same height as a height of a die. In this manner, a short length of bonding wires may be used to thereby reduce electrical resistance and inductance.

It should be understood, of course, that the foregoing relates to preferred embodiments of the invention and that modifications may be made without departing from the spirit and scope of the invention as set forth in the following claims.

We claim:

1. A flat-lead power semiconductor package comprising:
a relatively thick lead frame formed of a single gauge material having a thickness greater than 8 mils, the lead frame having a source lead, a gate lead, a drain lead, and a first lead frame pad, the first lead frame pad including a FET die coupled thereto;
source and gate lead bonding areas disposed in a same plane of a top surface of the FET die;
a plurality of large diameter aluminum bonding wires having a thickness of 20 mils connecting the source of the FET die to the source lead bonding area and a single bonding wire connecting the gate of the FET die to the gate bonding area; and
a resin body encapsulating the FET die, bonding wires and at least a portion of the lead frame.

2. The semiconductor package according to claim 1, wherein the lead frame pad is exposed through a bottom surface of the package.

3. The semiconductor package according to claim 1, wherein the source lead comprising a locking hole.

4. The semiconductor package according to claim 1, wherein the source lead comprises a fused solid piece.

5. The semiconductor package according to claim 1, wherein the source lead and gate lead are disposed adjacent each other on an opposite side of the semiconductor package from the drain lead.

6. The semiconductor package according to claim 1, wherein the drain lead comprises a notch for clamping a mold.

7. The semiconductor package according to claim 1, wherein the drain lead comprises a notch for positioning the package during reflow soldering.

8. The semiconductor package according to claim 1, further comprising a second source lead coupled to the FET die source.

9. The semiconductor package according to claim 8, wherein the source leads are disposed opposite each other.

10. The semiconductor package according to claim 8, wherein the source leads are stitch bonded to the FET die source.

11. The semiconductor package according to claim 1, further comprising a second FET die coupled to a second lead frame pad.

12. The semiconductor package according to claim 11, wherein drain leads of each FET die are disposed on a first side of the semiconductor package.

13. The semiconductor package according to claim 11, wherein drain leads of each FET die are disposed on opposite sides of the semiconductor package.

14. The semiconductor package according to claim 11, wherein the lead frame pads are exposed through the bottom surface of the package.

15. A flat-lead power semiconductor package housing an electronic device comprising:
a relatively thick lead frame formed of a single gauge material having a thickness greater than 8 mils and including a source lead, a gate lead, a drain lead, and a lead frame pad, the lead frame pad having the electronic device coupled thereto;
source and gate bonding areas disposed in a same plane of a top surface of the electronic device;
bonding wires connecting the electronic device to the source lead, the bonding wires being aluminum wires having a thickness up to 20 mils; and
a resin body encapsulating the electronic device, bonding wires and at least a portion of the lead frame.

* * * * *